(12) United States Patent
Liang

(10) Patent No.: US 7,768,786 B2
(45) Date of Patent: Aug. 3, 2010

(54) HEATSINK ASSEMBLY

(75) Inventor: Robert Liang, Taoyuan (TW)

(73) Assignee: Malico Inc., Taoyuan Hsien (TW)

( * ) Notice: Subject to any disclaimer, the term of this patent is extended or adjusted under 35 U.S.C. 154(b) by 0 days.

(21) Appl. No.: 12/348,913

(22) Filed: Jan. 6, 2009

(65) Prior Publication Data
US 2010/0172106 A1  Jul. 8, 2010

(51) Int. Cl.
*H05K 7/20* (2006.01)
*H01L 23/34* (2006.01)

(52) U.S. Cl. .................. 361/719; 257/719; 361/704; 361/710

(58) Field of Classification Search ............. 257/719; 361/710, 719
See application file for complete search history.

(56) References Cited

U.S. PATENT DOCUMENTS

| | | | |
|---|---|---|---|
| 6,093,961 A * | 7/2000 | McCullough | 257/718 |
| 6,153,932 A * | 11/2000 | Liang | 257/712 |
| 6,476,484 B1 * | 11/2002 | Liang | 257/718 |
| 6,644,396 B2 * | 11/2003 | Liang | 165/185 |
| 6,728,103 B1 * | 4/2004 | Smedberg | 361/703 |
| 7,307,842 B1 * | 12/2007 | Liang | 361/710 |
| 7,518,873 B2 * | 4/2009 | Park et al. | 361/710 |
| 7,564,687 B2 * | 7/2009 | Liu et al. | 361/704 |
| 7,619,892 B2 * | 11/2009 | Liang | 361/707 |

* cited by examiner

*Primary Examiner*—Gregory D Thompson

(57) ABSTRACT

A heatsink assembly includes a heatsink which has a base board and fins extending from a top thereof. The heatsink is directly put on the chip set. A positioning device includes a rectangular frame which is mounted to the heatsink and includes two first extensions and two second extensions extending from two pairs of opposite sides thereof. Each first extension has a hook extending from an inside thereof so as to hook the circuit board and the second extensions each have a first inclined surface engaged with the inclined surface defined in a periphery of the chip. Two flexible rods extend from the two opposite sides of the rectangular frame and each flexible rod has a pressing portion which presses on the top of the base board of the heatsink.

5 Claims, 7 Drawing Sheets

HEATSINK ASSEMBLY

BACKGROUND OF THE INVENTION

1. Field of the Invention

The present invention relates generally to a heatsink assembly, and more particularly, to a positioning device for connecting a heatsink to a chip set.

2. The Prior Arts

A chip set such as BGA, QFP and CPU used on a computer generates a lot of heat which should be removed from the chip set to keep the optimal operation of the chip set. A conventional heatsink is connected to the chip set and designed to remove the heat from the chip set quickly so as to maintain the chip set to work normally.

Most of the conventional heatsinks for removing the heat from a chip set working at a high speed operation include fins and a fan, the fins absorb the heat and the fan dissipates the heat from the fins.

One of the conventional ways for connecting the heatsink to the chip set is to clip the heatsink to the socket of the chip set by metal clips. However, the conventional metal clips include a complicated structure and require a longer assembly time. The clip tends to reach its fatigue limit quickly. Besides, the chip set can be damaged during processes of installing the clips and the clips might be disengaged from the socket during transportation. Furthermore, if the chip set is directly soldered to the circuit board, there will be no place for the clip to position the heatsink.

Generally, there is a gap about 0.25 mm between the chip set and the circuit board and which is narrow se that no one thinks about using the gap for the heatsink. Some assemblers use heat dissipation tapes to connect the heatsink with the circuit board or directly connect the heatsink to the circuit board by screws. The tapes are easily dried and removed from the surface of the chip set and the screws require holes drilled in the circuit board. There is a limited area on the circuit board so that the holes cannot be drilled in the desired positions. Therefore, most of the manufacturers for making the circuit boards do not drill holes in the circuit boards.

Some manufacturers develop a positioning device that includes a through hole at the center and four side plates extending from four sides of the device. Each side plate includes a hook on an inside thereof. When the heatsink extends through the through hole from the underside of the device, the hooks are hooked to two sides of the chip set, and the heatsink is securely positioned on the chip set.

However, due to manufacturing problems, the hooks might not hook to the sides of the chip set and the heatsink may not have straight or smooth bottom for the heatsink to contact the chip set properly. Therefore, the heat from the chip set cannot be transferred to the heatsink as desired. There are only two side plates hook to two sides of the chip set and the other two side plates are engaged with two slots defined in the heatsink so as to well position the device to the heatsink. The four side plates of the positioning device have the same height so that the heatsink has to remove material to form the two grooves through which the side plates of the side plates pass. However, the slots reduce the area for removing the heat from the chip set.

Yet another conventional positioning device for the heatsink includes a rectangular frame and two side plates extend from two opposite sides of the frame, and each side plate has two hooks on an inside thereof. Two positioning rods extend from the other two opposite sides of the frame. A plurality of flexible rods extend from the insides of the frame and each flexible rod has a protrusion on a bottom of a distal end thereof. A plurality of fins of the heatsink extend through the through hole in the center of the frame and hook on the two side plates hook two sides of the chip set. The positioning rods insert through holes defined through the heatsink, and the protrusions on the flexible rods are rested on the heatsink.

Another conventional positioning device includes two hooks on two sides to position the heatsink, and there are two stops on the other sides of the positioning device to prevent the relative movement of the positioning device and the chip set. Nevertheless, the latest electronic products are made to be even more compact and the printed circuit board is made to be smaller than before, while more parts are installed to the small printed circuit board. According to the regulation of JEDC, a 3 mm gap is required between the chip sets so as to avoid interference and over heat. In order to meet the requirement, more and more parts are installed to close to the BGA, so that which causes the stops mentioned above to push the rectangular frame upward so that the heatsink cannot be in contact with the chip set, and the heatsink is slidable relative to the positioning device.

The present invention provides a positioning device for positioning a heatsink to the chip set and the positioning device is designed to improve the shortcoming of the above mentioned positioning device which pushes the frame upward and causes the heatsink to not be in contact with the chip set, and the heatsink is slidable relative to the positioning device.

SUMMARY OF THE INVENTION

A primary objective of the present invention is to provide a heatsink assembly wherein a positioning device includes first extensions and second extensions on two pairs of opposite sides of a rectangular frame thereof, and a chip set is enclosed by the first and second extensions such that the chip set is well positioned and in contact with the heatsink.

According to the present invention, a heatsink assembly is provided and comprises a heatsink, a chip set, and a positioning device, wherein the heatsink has a board and multiple fins extending from a top of the board. The chip set includes a chip connected to a top of a circuit board and the heatsink is mounted on the chip set. The positioning device includes a rectangular frame which has a through hole defined in a center thereof. Two first extensions extend from two opposite sides of the rectangular frame. Each first extension has a hook extending from an inside thereof so as to hook to the circuit board. Two second extensions extend from the other two opposite sides of the rectangular frame. Two flexible rods extend from the two opposite sides having the second extensions of the rectangular frame and each flexible rod has a pressing portion extending perpendicularly from a distal end thereof. The rectangular frame is mounted to the heatsink and the second extensions are in contact with the circuit board.

The second extensions of the present invention can also be multiple rods.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1:
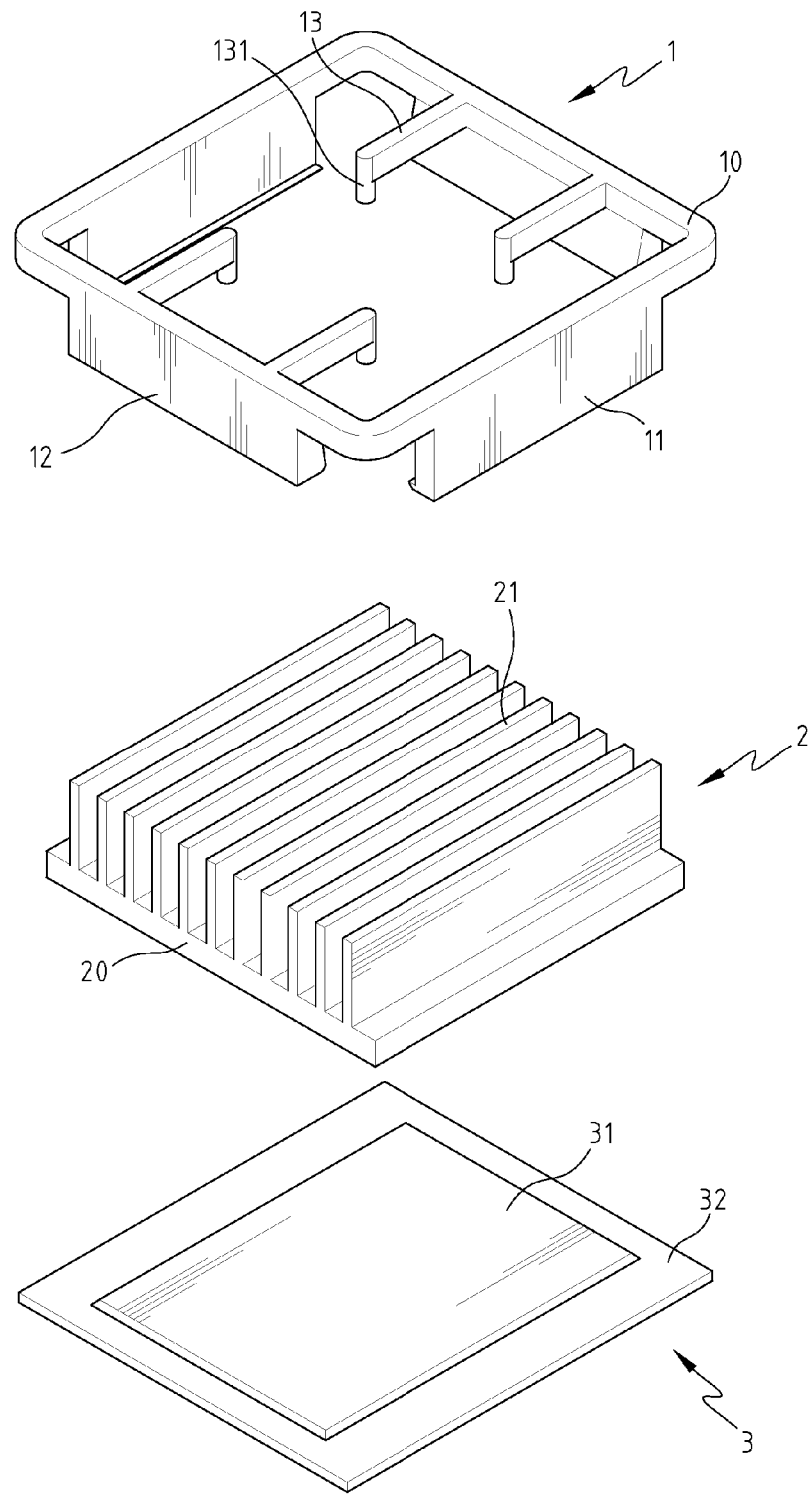
FIG. 1 is an exploded perspective view showing a heatsink assembly in accordance with a first embodiment of the present invention.

With reference to the drawings and in particular to FIGS. 1 to 4, a heatsink assembly in accordance with the present invention comprises a positioning device 1, a heatsink 2, and a chip set 3, wherein the positioning device 1 includes a rectangular frame 10 which has a through hole defined in a center thereof. Two first extensions 11 extending from two opposite sides of the rectangular frame 10 and two second extensions 12 extend from the other two opposite sides of the rectangular frame 10. Each first extension 11 has a hook 111 extending from an inside thereof. Two flexible rods 13 extend from the two opposite sides having the second extensions 12 of the rectangular frame 10 and each flexible rod 13 has a pressing portion 131 extending perpendicularly from a distal end thereof. Each of the second extensions 12 includes a first inclined surface 121 defined in an underside thereof. It is noted that the second extensions 12 may have a flat and horizontal distal surface.

The heatsink 2 includes a board 20 and multiple fins 21 extending from a top of the board 20. The heatsink 2 is an Aluminum heatsink 2 and made by way of extruding. The chip set 3 includes a chip 31 which is connected to a top of a circuit board 32. In this embodiment, the chip 31 is connected to a BGA socket on the circuit board 32, or soldered to the circuit board 32 directly. The chip 31 includes a second inclined surface 311 defined in a periphery thereof.

Figure 2:
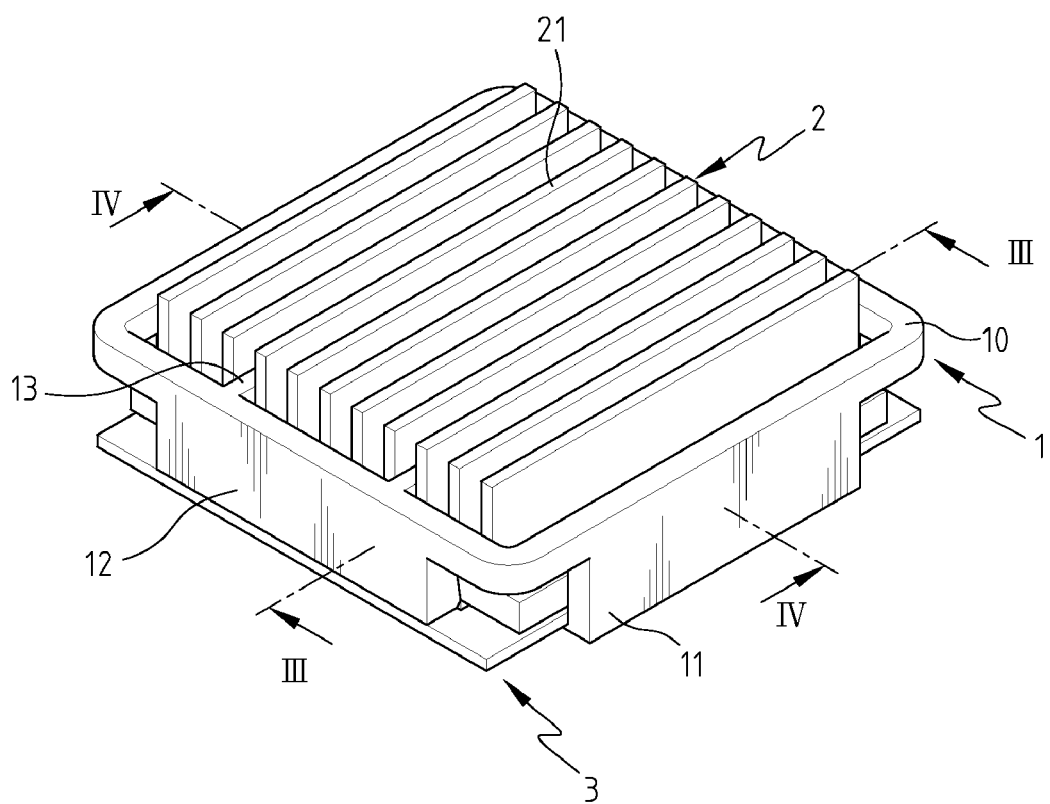
FIG. 2 is a perspective view showing the heatsink assembly in accordance with the first embodiment of the present invention.
Figure 3:
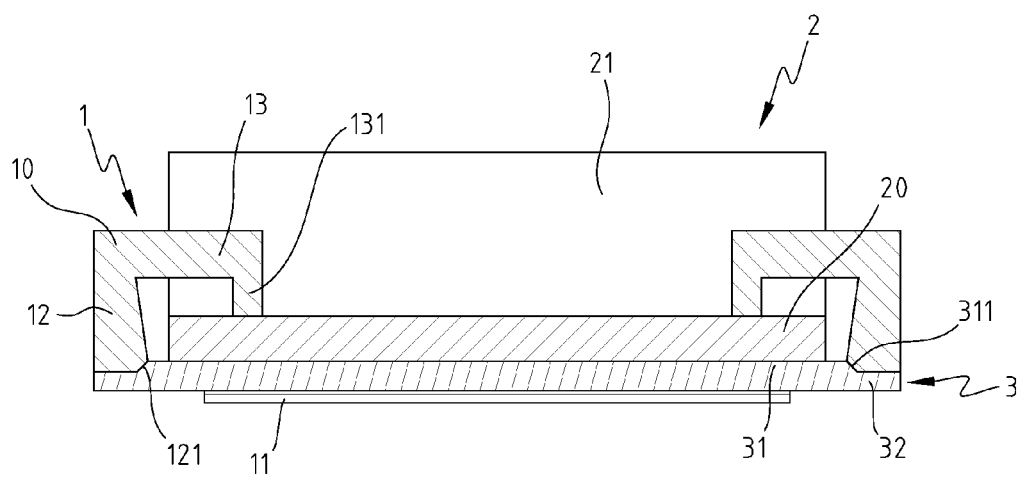
FIG. 3 is a cross sectional view taken along line III-III in FIG. 2.
Figure 4:
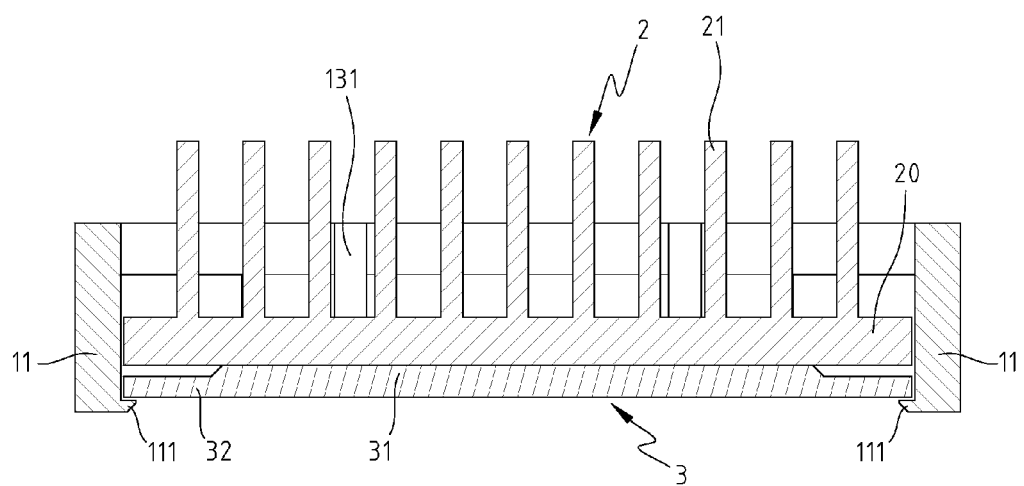
FIG. 4 is a cross sectional view taken along line IV-IV in FIG. 2.
Figure 5:
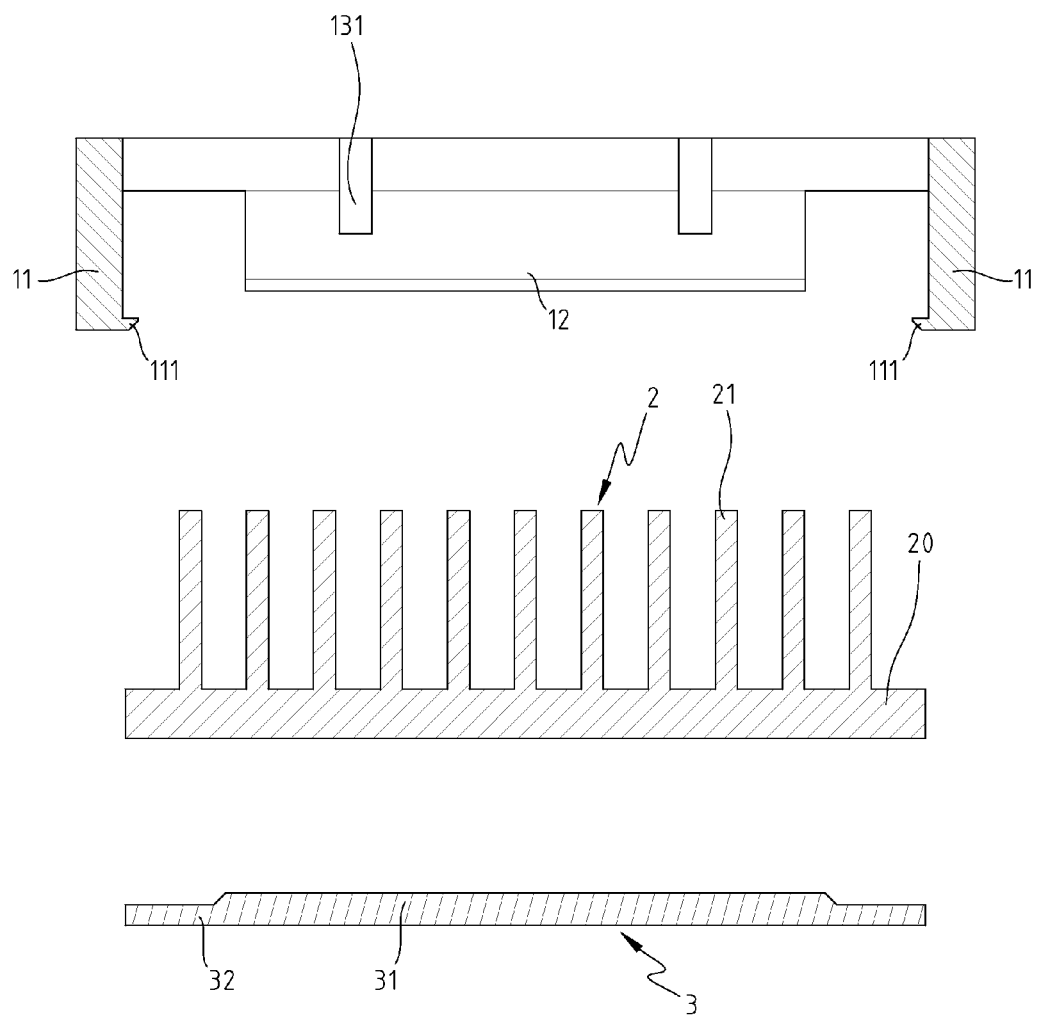
FIG. 5 is an exploded view to show the cross sectional view of each part of the heatsink assembly in accordance with the first embodiment of the present invention.

As shown in FIGS. 2 to 4, the heatsink 2 is put on the chip set 3 and the rectangular frame 10 is mounted to the heatsink 2 and the two respective hooks 111 hook an underside of the circuit board 32. The second extensions 12 are in contact with the circuit board 32. In particular, the first inclined surfaces 121 of the second extensions 12 are engaged with the second inclined surface 311 of the chip 31, such that the chip set 3 is well positioned and does not shift relative to the heatsink 2. The flexible rods 13 are engaged between the fins 21 and the pressing portions 131 press on the top of the board 20 of the heatsink 2 to keep close contact between the heatsink 2 and the chip set 3.

Figure 6:
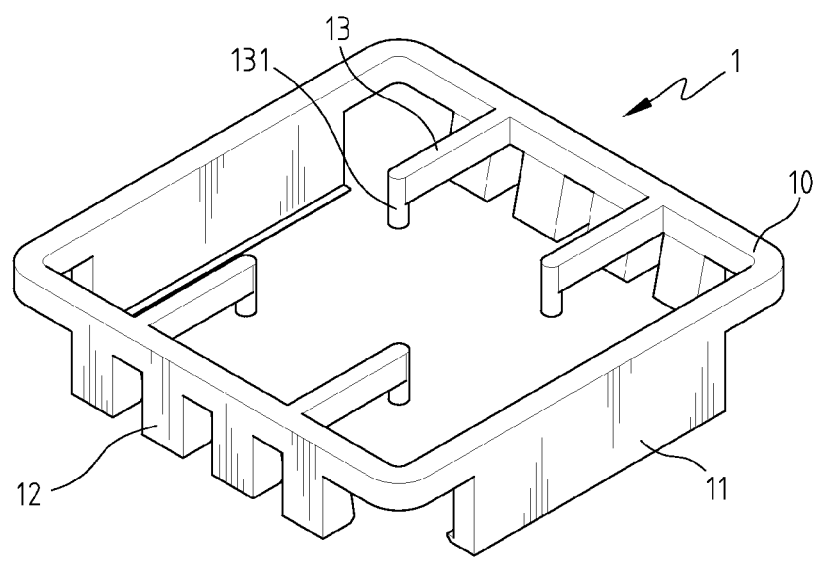
FIG. 6 shows a rectangular frame of the heatsink assembly in accordance with a second embodiment of the present invention.
Figure 7:
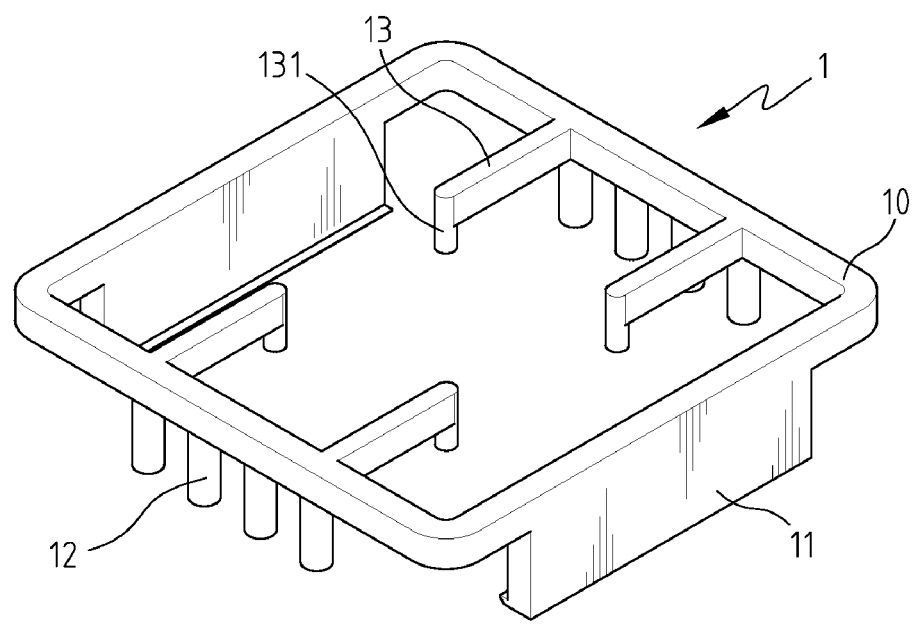
FIG. 7 shows a rectangular frame of the heatsink assembly in accordance with a third embodiment of the present invention.

As shown in FIG. 6, each of the second extensions 12 can be multiple rods and each of the multiple rods has a rectangular cross section. Each of the multiple rods includes the first inclined surface 121 defined in an underside thereof so as to be engaged with the second inclined surface 311. FIG. 7 shows that each of the multiple rods can also have a circular cross section and includes the first inclined surface to position the chip set 3.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A heatsink assembly, comprising:
a heatsink having a board and multiple fins extending from a top of the board;
a chip set including a chip connected to a top of a circuit board, the heatsink mounted on the chip set;
a positioning device including a rectangular frame which has first two opposite sides, second two opposite sides and a through hole defined in a center thereof, each of the first two opposite sides having a first extension extending downward and each first extension having a hook extending from an inside thereof, each of the second two opposite sides having a second extension extending downward and two flexible rods extending inward and each flexible rod having a pressing portion extending perpendicularly downward from a distal end thereof, the rectangular frame mounted to the heatsink and the two respective hooks hooking an underside of the circuit board and the second extensions being in contact with the circuit board.

2. The heatsink assembly as claimed in claim 1, wherein each of the second extensions includes a first inclined surface defined in an underside thereof and the chip includes a second inclined surface defined in a periphery thereof, the first inclined surfaces are engaged with the second inclined surface.

3. The heatsink assembly as claimed in claim 1, wherein each of the second extensions includes multiple rods.

4. The heatsink assembly as claimed in claim 3, wherein each of the multiple rods has a rectangular cross section, each of the multiple rods includes a first inclined surface defined in an underside thereof and the chip includes a second inclined surface defined in a periphery thereof, the first inclined surfaces are engaged with the second inclined surface.

5. The heatsink assembly as claimed in claim 3, wherein each of the multiple rods has a circular cross section.

* * * * *